United States Patent [19]

Shigenobu et al.

[11] 4,129,812
[45] Dec. 12, 1978

[54] ELECTRONIC TIMER

[75] Inventors: Hiromichi Shigenobu, Toyota; Toshiaki Isobe; Minoru Kondo, both of Nagoya, all of Japan

[73] Assignees: Toyota Jidosha Kogyo Kabushiki Kaisha; Kabushiki Kaisha Tokai Rika Denki Seisakusho, both of Aichi, Japan

[21] Appl. No.: 716,631

[22] Filed: Aug. 23, 1976

[30] Foreign Application Priority Data

Oct. 16, 1975 [JP] Japan .................. 50-125079

[51] Int. Cl.² ............................................ H02H 7/08
[52] U.S. Cl. .................................. 318/484; 307/141
[58] Field of Search .................. 318/484, 447, 285; 361/163, 196; 307/10 R, 10 LS, 294, 141; 315/82, 83

[56] References Cited

U.S. PATENT DOCUMENTS

| 3,626,239 | 12/1971 | Brock | 307/10 LS |
| 3,723,807 | 3/1973 | Tozzi | 315/83 |
| 3,993,914 | 11/1976 | Conrad et al. | 361/196 |

Primary Examiner—David Smith, Jr.
Attorney, Agent, or Firm—Koda and Androlia

[57] ABSTRACT

An electronic timer circuit comprising a condenser for storing charged electrons, a control switch opened and closed in response to the status of a sensed condition, a controlled switch for controlling a load, a high input impedance circuit coupled to the controlled switch for discharging the condenser and for causing the controlled switch to close when the control switch is closed and the charge stored in the condenser is greater than some predetermined amount and a switching component responsive to the control switch for restricting the discharge rate of the condenser to a low level.

13 Claims, 5 Drawing Figures

U.S. Patent   Dec. 12, 1978   4,129,812
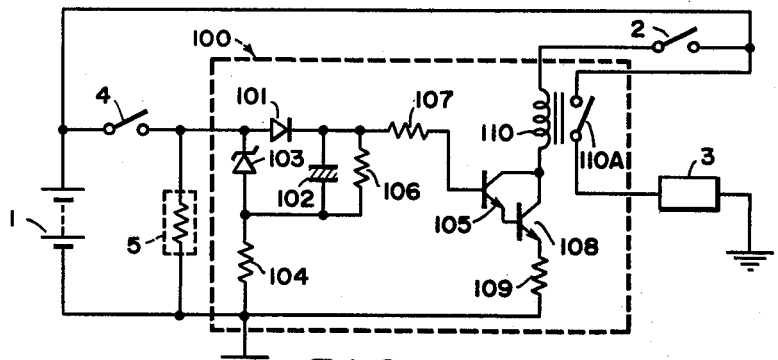
FIG. 1 PRIOR ART
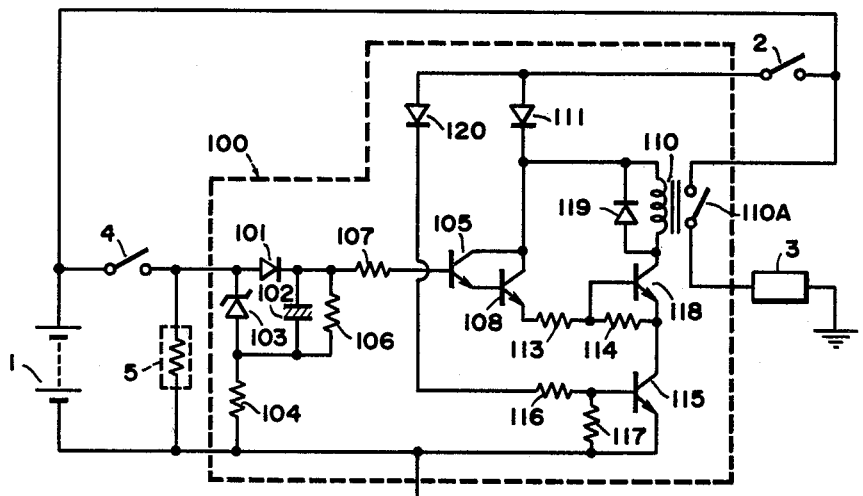
FIG. 2
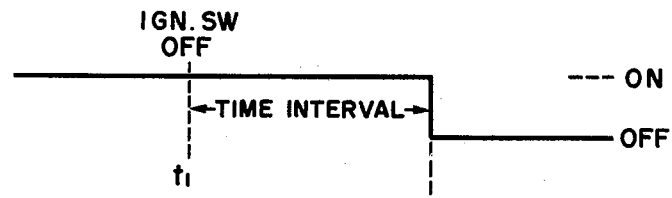
FIG. 3 (A) TIMER
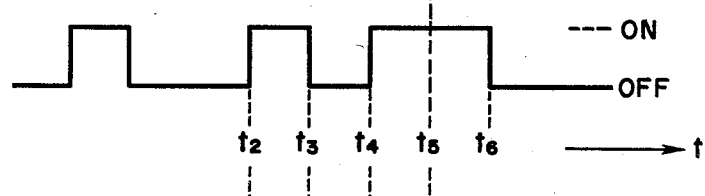
FIG. 3 (B) CONTROL SWITCH
FIG. 3 (C) LOAD

ELECTRONIC TIMER

FIELD OF INVENTION

This invention relates to electronic timer circuits and more particularly, to electronic timer circuits in automobiles for intermittently supplying electric power to a load for some predetermined interval after the ignition switch is turned off.

DESCRIPTION OF THE PRIOR ART

FIG. 1 illustrates and example of an electronic timer that controls a load in response to a thermal switch (for example, one that opens at normal temperature and closes at an abnormal temperature) as the control switch.

In FIG. 1, the electronic timer circuit 100 consists of a diode 101, condenser 102, constant voltage diode 103 such as a zener diode or the like, resistor 104, transistor 105, resistors 106 and 107, transistor 108, resistor 109 and relay 110 having relay contacts 110A. Source 1 is the supply voltage for the electronic timer 100. Control switch 2 (thermal switch) is a switch which opens and closes according to the temperature and opens and closes intermittently. Load 3 is a fan motor and is controlled by electronic circuit timer 100. Ignition switch 4 connected between voltage source 1 and condenser 102 causes condenser 102 to be charged when ignition switch 4 is closed. Furthermore, as soon as ignition switch 4 is opened, the timer operation starts and sets the initial timer starter point. When ignition switch 4 is closed, load 5 becomes part of the load of voltage source 1.

In operation, when ignition switch 4 is shut, condenser 102 is charged by electronic voltage source 1 through diode 101 and resistance 104. When condenser 102 is charged, constant voltage diode 103 acts to maintain the voltage applied to condenser 102 and diode 101 acts to block the discharge of condenser 102 through load 5 when ignition switch 4 is opened. Resistor 104 acts to protect the constant voltage diode 103 and also functions as the base bias resistor of transistor 105. Resistor 106 is a high valve in the range of thousands of ohms and is used to aid the self discharge of condenser 102. Resistor 107 provides over current protection for the base of transistor 105. At this stage, if ignition switch 4 is shut and control switch 2 is opened, condenser 102 is charged and transistors 105 and 108 do not operate and thereby do not cause relay 110 to close contacts 110A. Furthermore, if ignition switch 4 is shut and control switch 2 is closed, transistors 105 and 108 are operated thereby causing relay 110 to close its contacts 110A and supply power to load 3.

If when ignition switch 4 is opened, a control switch 2 is closed, voltage is applied to transistors 105 and 108 through relay 110. Transistors 105 and 108 are then driven on by the charge stored in condenser 102 and current flows through transistors 105 and 108. Since relay 110 is connected in series with the collector of transistor 108, relay 110 is actuated by the current flowing through transistors 105 and 108 thereby closing contacts 110 and coupling voltage source 1 to load 3.

With ignition switch 4 open and control switch 2 shut, condenser 109 is gradually discharged through the emitter follower circuit comprising transistors 105 and 108. So long as the charge on condenser 102 is sufficient to keep transistors 105 and 108 and control switch 2 is closed, relay 110 is actuated. However, when control switch 2 is opened, the base emitter junction of transistors 105 and 108 functions as a diode in the normal direction and condenser 102 is immediately discharged. Accordingly, if control switch 2 is again closed, there is no charge on condenser 102 to drive transistors 105 and 108 on. Accordingly, it should be apparent that the circuit of FIG. 1 only operates once to supply power to load 3 and only if control switch 2 is closed when ignition switch 4 is opened. Typically, in the situation where load 3 is an electric fan motor, when the fan motor stops, the temperature of the engine rises and the control switch 2 is again closed. This process is repeated again and again. For the circuit shown in FIG. 1, since condenser 102 is rapidly discharged when control switch 2 is opened for the first time, the circuit of FIG. 1 does not supply power to the load 3 when the temperature rises after the fan motor stops.

SUMMARY OF THE INVENTION

In keeping with the principles of the present invention, the objects are accomplished with the combination of a condenser for storing electrons, a control switch opened and closed in response to the status of a sensed condition, a controlled switch for controlling a load, a high input impedance circuit coupled to the controlled switch and a switching component responsive to said control switch for restricting the discharge rate of the condenser to a low lever. The high impedance circuit discharges the condenser at a predetermined rate and also causes the controlled switch to close when the control switch is closed and the charge stored in the condenser is greater than some predetermined value.

Accordingly, it is a general object of the present invention to provide an electronic timer circuit having a timer timing condenser which discharges at a rate substantially independent of the operation of the control switch.

It is still another object of the present invention to provide an electronic timer circuit with a timing capacitor which does not discharge immediately when the control switch is open.

It is yet another object of the present invention to provide an electronic timer circuit which is inexpensive and easy to manufacture.

BRIEF DESCRIPTION OF THE DRAWINGS

The above mentioned and other features and objects of the present invention will become more apparent by reference to the following description taken in conjunction with the accompanying drawings, wherein like reference numerals denote like elements, and in which:

FIG. 1 illustrates a prior art electronic timer circuit;

FIG. 2 shows an electronic timer circuit in accordance with the teachings of the present invention; and FIGS. 3(A), (B) and (C) illustrate the signals of the embodiment of FIG. 2.

DESCRIPTION OF THE PREFERRED EMBODIMENTS

Referring to FIG. 2, shown therein is an embodiment of the electronic timer circuit in accordance with the teachings of the present invention. In FIG. 2, the electronic timer circuit 100 includes transistors 105 and 108 having the collector of transistor 105 coupled to the collector of transistor 108 and the emitter of transistor 105 coupled to the base of transistor 108. One end of resistor 107 is coupled to the base of transistor 105 and the other end of resistor 107 is coupled to the junction formed by one end of resistor 106, one end of timing condenser 102 and the cathode end of diode 101. One end of resistor 104 is grounded and the other end of resistor 104 is coupled to the junction formed by the other end of resistor 106, the other end of timing condenser 102 and the anode end of constant voltage diode 103. The cathode end of constant voltage diode 103 and the anode end of diode 101 are coupled together.

The anode end of diodes 120 and 111 are coupled together and the cathode ends of diodes 120 and 111 are coupled respectively to one end of resistor 116 and the collector of transistor 108. Diode 119 is coupled across the coil of relay 110 and the junction formed by the cathode end of diode 119 and one terminal of the coil of relay 110 is coupled to the collector of transistor 105. The other terminal of the coil of relay 110 is coupled to the collector of transistor 118.

Resistor 113 is coupled between the emitter of transistor 108 and the base of transistor 118. Resistor 114 is coupled between the base and emitter of transistor 118 and the emitter of transistor 118 is coupled to the collector of transistor 115. The other end of resistor 116 is coupled to the base of transistor 115 and to one end of resistor 117. The other end of resistor 117 and the emitter of transistor 115 are grounded. The circuit of transistors 105, 108 and 118 comprises a high input impedance Darlington emitter follower circuit.

One terminal of ignition switch 4 is coupled to one end of load 5 and to the junction formed by the anode of diode 101 and the cathode of constant voltage diode 103. The other terminal of switch 4 is coupled to a positive source of voltage represented by voltage source 1. The other end of load 5 and voltage source 1 are grounded. The two terminals of control switch 2 are coupled respectively to the junction formed by the anodes of diodes 120 and 111 and a positive source of voltage. One contact of normally open relay contacts 110A of relay 110 is coupled to a positive source of voltage and the other contact of relay contacts 110A is coupled to one end of load 3 and the other end of load 3 is grounded.

For the purposes of illustration, assume that control swtich 2 is initially open, that ignition switch 4 is closed, and condenser 102 is fully charged. In operation, when ignition switch 4 is opened, the electrons stored in condenser 102 begin to discharge. The discharged electrons through resistor 107 across the base emitter junction of transistor 105 which is in the nonconducting state and across the base emitter junction of transistor 108 which is also in the nonconductive state. Moreover, the current discharged from condenser 102 discharges through resistors 113 and 114 and across the collector emitter of transistor 115. However, since the discharged current flowing across the collector to emitter of transistor 115 is only a leakage current, the discharge of the electrons stored in condenser 102 occurs very gradually. Diode 111 is provided to prevent condenser 102 from discharging through resistors 116 and 117.

When control switch 2 is closed, voltage from source 1 is applied to the collectors of transistors 105 and 108 through diode 111. The charge stored in condenser 102 is applied to the bases of transistors 105 and 108 and thereby causing them to conduct. Collector voltage is also applied to transistor 115 through diode 111 and resistors 113 and 114. Simultaneously, current flows in resistors 116 and 117 through control switch 2 and transistor 115 is driven into the conductive state by its voltage developed across resistor 117. As a result thereof, current flows through the coil of relay 110 thereby causing relay contacts 110A to close. Load 3 is thereby supplied with power from source 1. Diode 119 acts to absorb the inverse voltage generated by the inductance of the coil of relay 110 when the current to relay 110 is shut off. Furthermore, diode 120 is provided to prevent the outflow of current through resistors 117 and 116 and through control switch 2 in the situation where the source 1 is mistakenly connected with inverse polarity.

In this example, since the input impedance of the emitter follower circuit, which consists of transistors 105, 108 and 118 and resistors 113 and 114, is very high, the discharge of condenser 102 is accomplished very gradually. Furthermore, when control switch 2 is opened, collector voltage is not supplied to transistor 118 and consequently contacts 110A of relay 110 are opened and the power supplied to load 3 is terminated. So long as condenser 102 has not discharged below some predetermined level sufficient to turn on transistors 105, 108 and 118 when control switch 2 is closed again, relay 110 is actuated thereby closing contacts 110A and supplying power to load 3 again.

As is clear from the foregoing discussion, by using transistor 115 as the switching component, the discharge rate of condenser 102 remains at a level equal to the diode reverse direction current of transistor 115 when control switch 2 is open. Accordingly, when control switch 2 is closed again, a sufficient number of electrons are stored in condenser 102 to operate relay 110.

FIGS. (3A), (B) and (C) are diagrams of signals to illustrate the performance of the embodiment shown in FIG. 2.

FIG. 3(A) illustrates the interval during which the electronic timer 100 maintains its function as a timer, the discharge, of condenser 102. In FIG. 3(A), time $t_1$ is the time at which the ignition switch is opened and the charging of condenser 102 is terminated. Time $t_5$ is the discharge time of condenser 102.

FIG. 3(B) is a diagram of the signals showing the on and off operation of control switch 2. Control switch 2 acts intermittently and irregularly according to the temperature and, as shown in FIG. 3(B), control switch 2 is shut at time $t_2$. When control switch 2 is shut, transistors 115 and 118 both conduct and relay 110 is actuated and contacts 110A are closed.

FIG. 3(C) is a signal diagram to show the power supplied to load 3. Since relay contacts 110A are closed at time $t_2$ when control switch 2 is closed, the power supplied to load 3 comprises that supplied by source 1. The power supplied to load 3 continues the control switch 2 is closed, the time from $t_2$ to $t_3$.

At time $t_4$ when control switch 2 is shut again, power is again supplied to load 3. Although control switch 2 is closed until time $t_6$, as shown in FIG. 3(A), at time $t_5$ the discharge of condenser 102 is completed and the timer function is terminated. Accordingly, at time $t_5$ the power supplied to load 3 is interrupted.

Although in the embodiment of this invention a thermal switch is shown as the control switch, it is possible to use other types of switches or semiconductor switches or the like according to the purpose of the timer. Furthermore, the ignition switch can be replaced by some other type of switch. In addition, any high input impedance circuit can be substituted for the Darlington transistor circuit illustrated in the embodiment of FIG. 2. Such high input impedance circuits include field effect transistors or other nontransistor circuits. The switching component of transistors 115 can also be replaced by other switching components such as a thyristor or the like.

In all cases it is understood that the above described embodiment is merely illustrative of but one of the many possible specific embodiments which can represent applications of the principals of the present invention. Numerous and varied other arrangements can be readily devised in accordance with these principals by those skilled in the art without departing from the spirit and scope of the invention.

I claim:

1. An electronic timer circuit comprising:
 a source of electrical power;
 a condenser coupled to said source of power for storing a charge;
 a control switch means;
 a load;
 a controlled switch means for controlling the power to said load;
 a high input impedance circuit for discharging said stored charge in said condenser at a predetermined rate and for causing said controlled switch means to allow power to be supplied to said load when said control switch means is closed and said charge stored in said condenser is greater than some predetermined amount; and
 a switching component coupled to said high input impedance circuit which is actuated in response to said control switch means to reduce the discharge current through said switching components whenever said controlled switch means is opened and not allowing power to be supplied to said load.

2. An electronic timer circuit according to claim 1 further comprising a power switch provided between said condenser and said source of electrical power for interrupting the charge being stored in said condenser from said source of electrical power.

3. An electronic timer circuit according to claim 2 wherein said control switch means comprises a thermal switch which is open when the temperature is below some predetermined amount and which closes when the temperature exceeds said predetermined amount.

4. An electronic timer according to claim 3 wherein said power switch comprises the ignition switch of an automobile, said source of electrical power comprises the battery of an automobile and said load comprises a fan motor.

5. An electronic timer circuit according to claim 1 wherein said high input impedance circuit comprises a Darlington transistor circuit.

6. An electronic timer circuit according to claim 5 wherein said controlled switch means comprises a relay having its coil coupled to said Darlington circuit and said control switch means and at least one pair of normally opened relay contacts provided between said fan motor and said battery.

7. An electronic timer circuit according to claim 5 wherein said high impedance circuit further comprises a transistor having a base coupled to said control switch means.

8. An electronic timer circuit according to claim 1 wherein said high input impedance circuit comprises an emitter follower transistor circuit and a transistor having its base coupled to said control switch means.

9. An electronic timer circuit according to claim 1 wherein a discharge circuit including a resistor is coupled in parallel with said condenser.

10. An electronic timer circuit according to claim 1 wherein said switching component comprises a transistor having its collector coupled to said high input impedance circuit, its emitter coupled to a ground and its base coupled to said control switch means.

11. An electronic timer circuit comprising:
 a source of electrical power;
 a condenser connected to said source of electrical power for storing a charge;
 a load;
 a high input impedance switching circuit including an input circuit is connected to said condensor so that the input circuit becomes a discharge circuit of said condesnor and an output circuit is connected to said load; and
 a switching component inserted in series with said discharge circuit which is selectively controlled on and off under the predetermined condition.

12. An electronic timer circuit according to claim 11 wherein said switching component comprises a control switch means selectively controlled on and off under the predetermined condition, and a transistor having its collector and emitter inserted into said discharge circuit and its base connected to said control switch means.

13. An electronic timer circuit comprising:
 a source of electrical power;
 a power switch;
 a condenser connected to said source of electrical power through said power switch for storing a charge while said power switch is conducted;
 a relay having a relay coil and at least one pair of normally opened relay contacts;
 a high input impedance switching circuit including an input circuit connected to said condenser so that the input circuit becomes a first discharge circuit of said condenser and an output circuit connected to said relay coil;
 a second discharge circuit connected in parallel with said condenser to be a second discharge circuit for said condenser;
 a control switch means selectively controlled on and off under a predetermined condition;
 a transistor having its collector and emitter inserted into said first discharge circuit and its base connected to said control switch means; and
 a load connected to said source of electrical power through said relay contacts.

* * * * *